United States Patent [19]

Hulseweh

[11] Patent Number: 4,573,257

[45] Date of Patent: Mar. 4, 1986

[54] METHOD OF FORMING SELF-ALIGNED IMPLANTED CHANNEL-STOP AND BURIED LAYER UTILIZING NON-SINGLE CRYSTAL ALIGNMENT KEY

[75] Inventor: Terry S. Hulseweh, Mesa, Ariz.

[73] Assignee: Motorola, Inc., Schaumburg, Ill.

[21] Appl. No.: 650,931

[22] Filed: Sep. 14, 1984

[51] Int. Cl.[4] .................... H01L 21/20; H01L 21/74; H01L 21/76

[52] U.S. Cl. .................................. 29/576 E; 29/574; 29/576 B; 29/578; 29/576 W; 148/1.5; 148/175; 148/188; 148/DIG. 102; 148/DIG. 85; 148/DIG. 106; 148/DIG. 111; 148/DIG. 122; 156/612; 156/628; 156/653; 156/657; 156/659.1; 357/48; 357/50; 357/59; 427/86

[58] Field of Search ............ 29/576 E, 576 B, 576 W, 29/574, 578; 148/175, 1.5, DIG. 111, DIG. 102, DIG. 122, DIG. 106, DIG. 85, 188; 156/612, 628, 653, 657, 659.1; 357/48, 50, 59; 427/86

[56] References Cited

U.S. PATENT DOCUMENTS

| | | | |
|---|---|---|---|
| 3,500,139 | 3/1970 | Frouin et al. | 357/48 X |
| 3,648,128 | 3/1972 | Kobayashi | 357/48 |
| 3,702,790 | 11/1972 | Nakanuma et al. | 148/DIG. 122 |
| 3,771,218 | 11/1973 | Langdon | 29/578 |
| 3,791,882 | 2/1974 | Ogive | 148/174 |
| 3,825,450 | 7/1974 | Schoeff | 148/174 |
| 3,833,429 | 9/1974 | Monma et al. | 148/1.5 |
| 3,947,299 | 3/1976 | Weijland et al. | 148/188 X |
| 4,090,915 | 5/1978 | Keller | 156/628 |
| 4,124,933 | 11/1978 | Nicholas | 29/578 |
| 4,199,380 | 4/1980 | Farrell et al. | 148/1.5 |
| 4,239,559 | 12/1980 | Ito | 148/188 |
| 4,356,211 | 10/1982 | Riseman | 427/85 |
| 4,369,565 | 1/1983 | Muramatsu | 29/580 |
| 4,376,336 | 3/1983 | Endo et al. | 29/578 X |
| 4,438,556 | 3/1984 | Komatsu et al. | 29/576 B |
| 4,454,646 | 6/1984 | Joy et al. | 29/576 W |
| 4,454,647 | 6/1984 | Joy et al. | 29/576 W |
| 4,463,492 | 8/1984 | Maeguchi | 29/576 B |

*Primary Examiner*—William G. Saba
*Attorney, Agent, or Firm*—Robert M. Handy

[57] ABSTRACT

A process is described for fabricating self-aligned buried doped regions in semiconductor devices and integrated circuits which avoids any need for delineation of the buried doped regions in the active portions of the device. Avoiding delineation improves the quality of the epitaxial layer used to cover the buried doped regions thereby improving overall performance and yield. Multiple mask layers are used in connection with a single mask pattern to achieve self-alignment. One mask layer consists of a material with a modifiable etch rate, e.g. polysilicon. A portion of the single crystal substrate is rendered non-single crystal and used as an alignment key which is propagated through the epitaxial layer grown over the undelineated buried doped regions. The dimensions and separations of the self-aligned buried doped regions can be precisely controlled.

20 Claims, 22 Drawing Figures

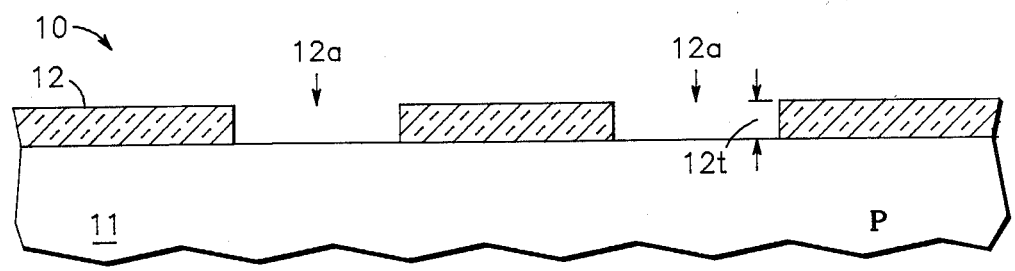
— PRIOR ART —  *FIG. 1A*
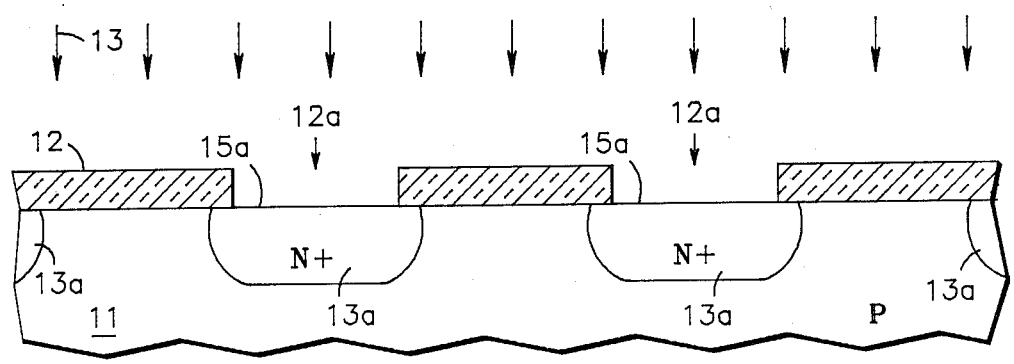
— PRIOR ART —  *FIG. 1B*
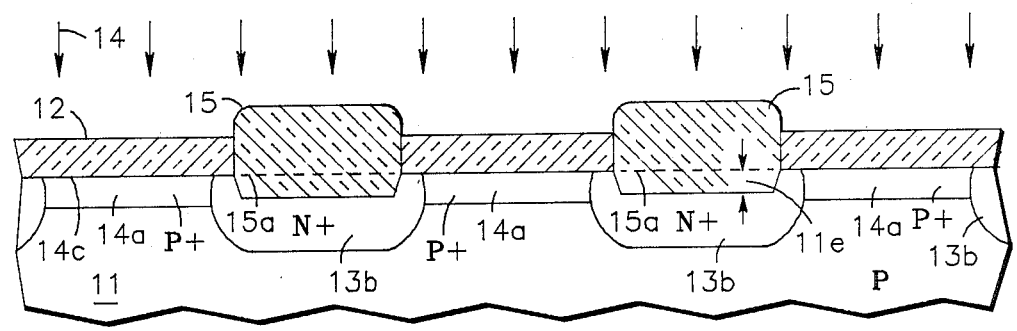
— PRIOR ART —  *FIG. 1C*
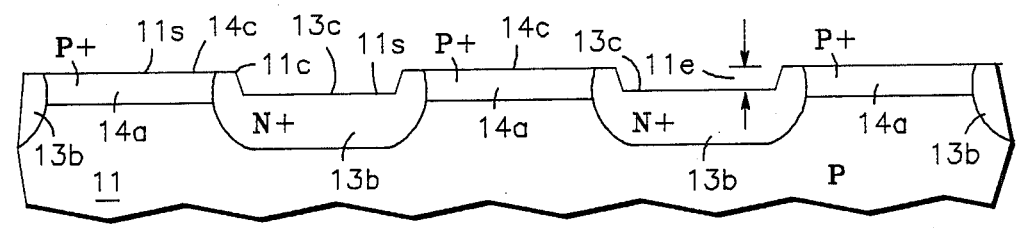
— PRIOR ART —  *FIG. 1D*

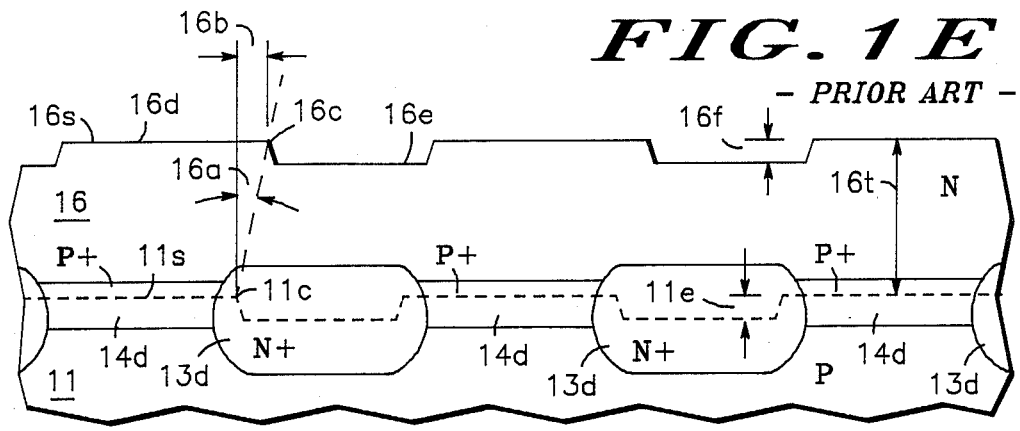
FIG. 1E — PRIOR ART —
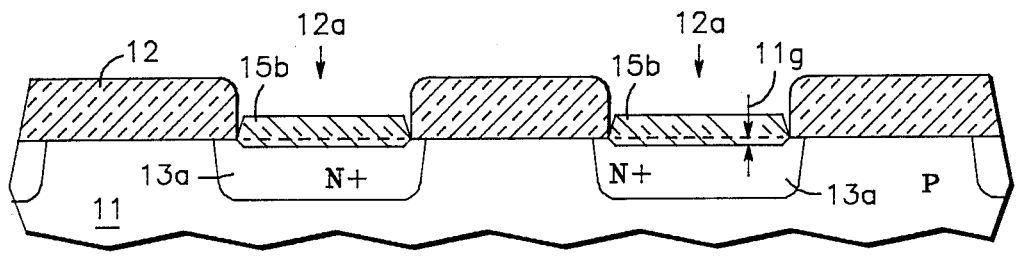
— PRIOR ART — FIG. 1F
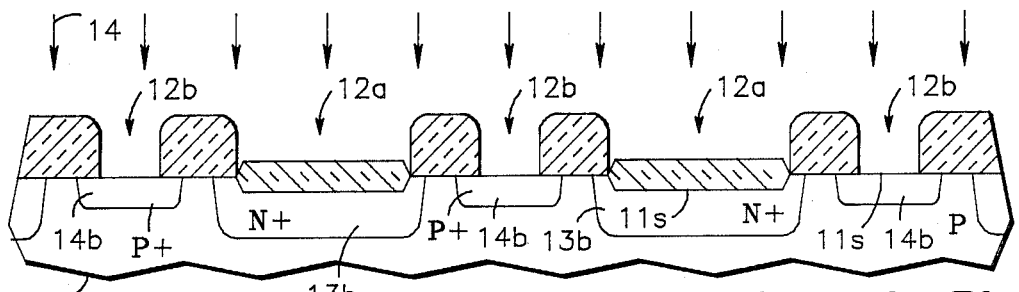
— PRIOR ART — FIG. 1G
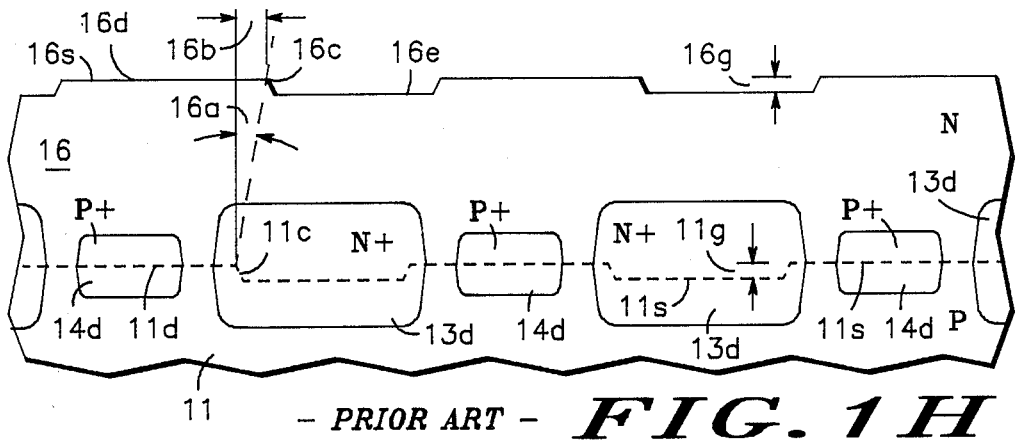
— PRIOR ART — FIG. 1H

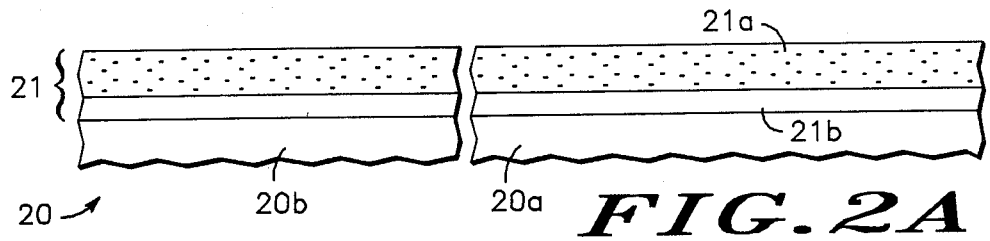
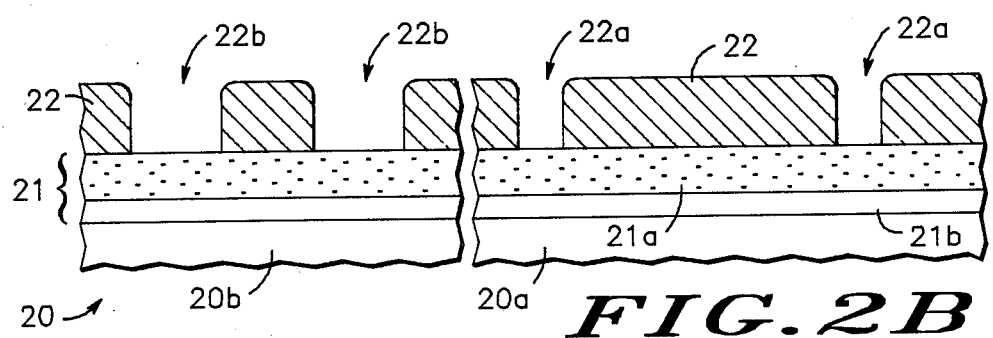
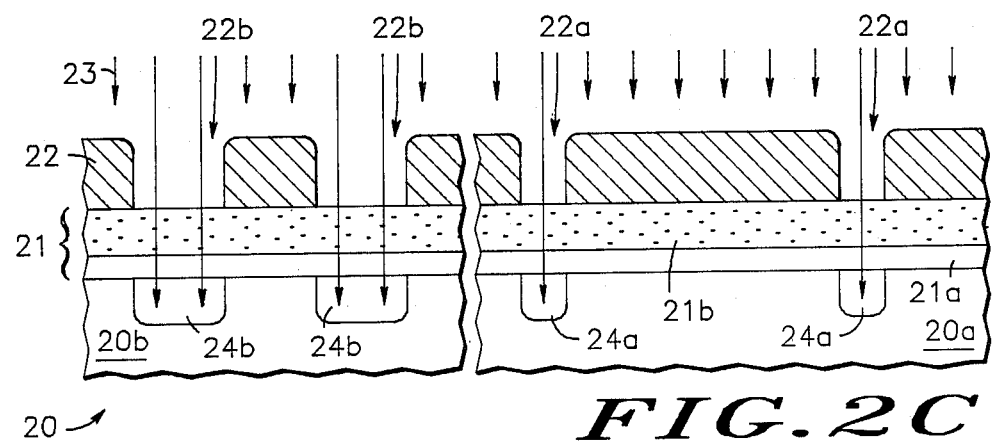
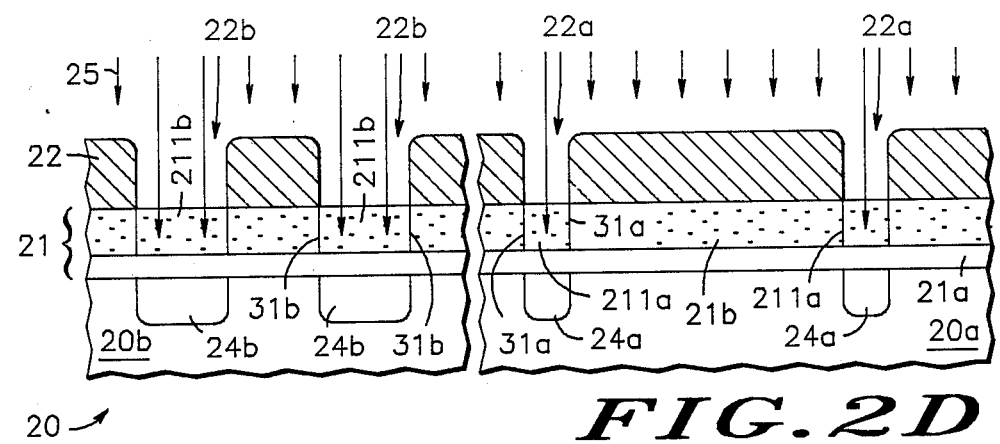

METHOD OF FORMING SELF-ALIGNED IMPLANTED CHANNEL-STOP AND BURIED LAYER UTILIZING NON-SINGLE CRYSTAL ALIGNMENT KEY

FIELD OF THE INVENTION

This invention relates in general to means and methods for providing self-aligned doped regions in semiconductor devices and, more particularly, to improved means and methods for providing non-delineated self-aligned buried regions of controlled size and spacing in integrated circuits.

BACKGROUND ART

It is commonplace in the semiconductor art to desire to obtain various doped regions in a semiconductor substrate which have a predetermined size and location with respect to each other. In many situations doped regions of the same or opposite conductivity type must be spaced apart laterally by small but carefully controlled amounts. For example, buried collector regions and channel-stop regions in bipolar integrated circuits are generally desired to be located in close proximity but not touching. They must have precisely defined sizes. In such situations it is highly desirable to be able to locate the various doped regions in such a way that they self-align. This is generally accomplished by having the size and location of the various regions determined by a single master mask without need for intermediate precision alignment steps. If this can be achieved, smaller and more densely packed devices and integrated circuits can be fabricated. This is highly desirable.

A number of fabrication schemes for determining the size and location of critical device and circuit areas have been developed. A typical procedure is described in U.S. Pat. No. 4,199,380 to M. G. Farrell et al. However, the various prior art fabrication methods have a number of limitations. A particular weakness of prior art fabrication methods arises when it is necessary to provide buried doped regions within the device structure. Examples of such buried doped regions are buried collector regions and buried channel-stop regions in bipolar integrated circuits. Since the buried regions are generally covered by an opaque epitaxial layer, special provisions must be made for marking or delineating their location under the epitaxial layer in order that other device regions can be aligned therewith. The delineation methods currently in use are imprecise, subject to error, and a source of defects which adversely affect other device regions during device manufacture. Thus, there is a continuing need for improved means and methods for obtaining buried doped regions in semiconductor devices which avoid the problems associated with existing delineation schemes and which provide for self-alignment of multiple buried regions of the same or opposite doping.

Accordingly, it is an object of the present invention to provide an improved means and method for forming buried doped regions in semiconductor devices.

It is a further object of the present invention to provide an improved means and method for alignment of subsequent device regions to buried doped regions without need for delineation of the buried doped regions.

It is an additional object of the present invention to provide improved means and methods for avoiding the material defects introduced in epitaxial overlayers by prior art buried layer delineation means and methods.

It is a further object of the present invention to provide an improved means and method for obtaining more compact integrated circuit structures by eliminating the need for an alignment step in locating buried channel-stop regions with respect to buried collector regions.

It is an additional objective to achieve the above noted objectives simultaneously.

As used herein, the words "polycrystalline" or "poly" are intended to refer to all non-single crystal forms of solids. Further, as used herein, the words "dip etching" are intended to refer to all forms and means of blanket etching or blanket erosion, and are not intended to be limited merely to wet chemical etching techniques. As used herein the word "delineation" is intended to refer to topographical surface features which reveal the presence of a device region extending to or buried beneath the surface of a semiconductor substrate.

SUMMARY OF THE INVENTION

The attainment of the foregoing and other objects and advantages is achieved through the present invention wherein there is provided a process for fabricating semiconductor devices comprising: providing a semiconductor substrate having a surface with a device portion and an alignment key portion; covering the surface with a first masking layer having a modifiable etch rate; covering the first masking layer with a second masking layer having first open portions exposing first portions of the first masking layer located above first regions of the device portion of the substrate, and having second open portions exposing second portions of the first masking layer located above first regions of the alignment key portion of the substrate; doping the first regions of the device portion of the substrate through the exposed first portions of the first masking layer; modifying the etch rate of the first and second portions of the first masking layer exposed in the first and second open portions of the second masking layer; creating holes in the first masking layer by removing those portions of the first masking layer whose etch rate has not been modified in the preceding steps, the holes in the first masking layer lying above second regions of the device portion and a key region of the alignment key portion of the substrate; doping the second regions of the device portion of the substrate through the holes in the first masking layer; rendering the key region of the alignment key portion of the substrate non-single crystal; and forming a semiconductor layer on the surface of the substrate which is non-single crystal above the key region of the substrate, single crystal above the alignment key portion of the substrate adjacent the non-single crystal key region, and which is single crystal above the first and second regions of the device portion of the substrate.

It is desirable, prior to the creating step to treat the first masking layer, for example by heating, to expand by a predetermined amount the lateral dimensions of the first and second portions of the first masking layer whose etch rate was previously modified, in order to control the separation of the first and second doped regions in the device portion of the substrate. It is further desirable that the first masking layer comprise a polycrystalline semiconductor layer superposed on a layer resistant to etchants which etch the polycrystalline layer. The etch rate of the first masking layer may be conveniently modified by doping using ion implantation. The first and second regions of the device portion of the substrate are conveniently doped using ion implantation. The energy of the ion implantation is adjusted for the doping of the first region of the device portion of the substrate so that the dopant ions pass through the first masking layer and deposit in the substrate. The doping and masking procedures do not require delineation of the first and second regions in the substrate, and the substrate surface and semiconductor layer surface above the device portion of the substrate remain substantially smooth and featureless.

Alignment to the buried doped regions is made possible by the propagation of the non-single crystal key region in the substrate through the superposed semiconductor layer so that it is visible on the surface of the layer. The key region and the first and second doped regions are all self-aligned since they are all delineated by the openings created in the second masking layer, or by images of those openings transferred to the first masking layer. The separation of the first and second doped regions in the device portion of the substrate can be precisely set by controlling the lateral expansion of the altered etch rate regions in the first masking layer. A further advantage of this process is that there is no need to delineate the first and second doped regions. Hence they present a smooth surface for the growth of the single crystal layer with which they are covered. Accordingly, the quality of this single crystal layer is not degraded by defects generated at delineation steps.

There is further provided a semiconductor structure comprising, a substantially single crystal semiconductor wafer having a first surface in which have been formed at least one non-single crystal alignment key region and at least one doped region positioned in a known location with respect to the alignment key region, an epitaxial layer covering the first surface and having a polycrystalline region in registration with the non-single crystal region of the substrate, wherein the polycrystalline region is visible from an exterior surface of the layer, and an additional doped region formed from the exterior surface of the epitaxial layer and aligned with respect to the doped region of the substrate by means of the polycrystalline region in the epitaxial layer. The polycrystalline region in the epitaxial layer is propagated from the non-single crystalline region in the substrate. The surface of the epitaxial layer above the doped region in the substrate is smooth and undelineated.

BRIEF DESCRIPTION OF THE DRAWINGS

FIGS. 1A-H show simplified schematic cross-sectional views of a portion of a semiconductor device at different stages of fabrication, according to the prior art;

FIGS. 2A-J show simplified schematic cross-sectional views of a portion of a semiconductor device at different stages of fabrication, according to the present invention;

DETAILED DESCRIPTION OF THE DRAWINGS

Figure 2E:
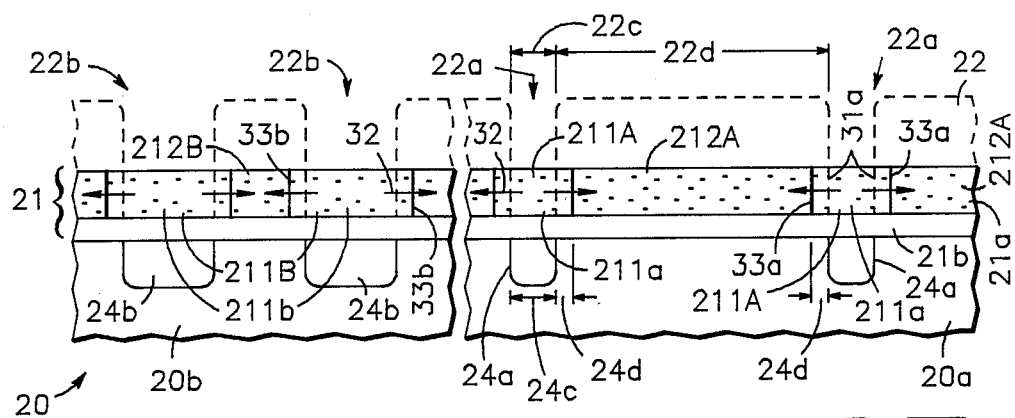

For purposes of explanation, the device structures illustrated herein are shown as bipolar devices or device portions having particular combinations of N and P layers, However, those of skill in the art will understand that these device structures and doped layer combinations are presented merely as an aid to understanding and are not intended to be limiting, and that other combinations of N and P layers can equally well be used and fabricated according to the teachings of the present invention.

FIGS. 1A-H show in schematic form, simplified cross-sections of portions of prior art semiconductor device 10 having P− substrate 11 covered by masking layer 12 of thickness 12t containing holes 12a (FIG. 1A). Masking layer 12 is typically of oxide or nitride or a combination. N-type ions 13 are provided using a conventional ion implanter to dope N+ regions 13a in P− substrate 11 through holes 12a in mask layer 12 (FIG. 1B). Surface 15a of substrate 11 above N+ doped regions 13a is oxidized to produce thick oxide regions 15 which block openings 12a, and act as masks for a second ion implantation doping step wherein P-type ions 14 are implanted into substrate 11 to form P+ doped regions 14a underneath mask layer 12 (FIG. 1C). Regions 15 must be sufficiently thick to block ions 14. Ions 14 must have sufficient energy to penetrate mask layer 12. Portion 11e of surface 15a of substrate 11 above regions 13a is consumed in forming thick oxide regions 15, as is indicated by dashed lines 15a in FIG. 1C, leaving behind shallower doped regions 13b which lie below surface 14c by amount 11e (FIGS. 1C-D). P+ doped regions 14a overlap N+ doped regions 13a near corners 11c. However, regions 13a are usually doped sufficiently strongly so that the overlap regions remain N-type.

Surface 11s of substrate 11 is then exposed by removing masks 12 and 15 (FIG. 1D). Surface 11s is delineated, that is, portions 13c of surface 11s above doped region 13b and portions 14c above doped regions 14a differ in elevation by amount 11e, corresponding to the portion of substrate 11 which was consumed in forming oxide region 15. Surface portions 13c and 14c meet at corner 11c (FIG. 1D). Epitaxial layer 16 is then grown on surface 11s. Epitaxial layer 16 follows the contour of surface 11s, so that elevated portions 14c and depressed portions 13c of surface 11s are replicated in portions 16d and 16e of surface 16s of layer 16 (FIG. 1E). During formation of buried layer 16, doped regions 14c and 13c expand into epitaxial layer 16 by diffusion to form buried doped P+ regions 14d and N+ regions 13d. Regions 13d conventionally are used as buried collector regions while regions 14d serve as buried channel-stop regions between adjacent collector regions. A disadvantage of the prior art approach illustrated in FIGS. 1A-E is that regions 13d and 14d overlap. This tends to reduce the breakdown voltage of the devices, which is generally not desirable.

FIGS. 1F-H illustrate a variation of the prior art methods in which openings 12a in mask layer 12 are closed only by thin oxide layer 15b. An additional mask and alignment step (not shown) is then used to open holes 12b in mask layer 12 through which ions 14 can be implanted or diffused in order to form regions 14b which do not overlap regions 13b (FIG. 1G). Since mask region 15b is thinner, only a much smaller amount 11g of substrate 11 is consumed during formation of regions 15b (FIG. 1F). Thus, delineation amount 11g in surface 11s of substrate 11 and delineation amount 16g in surface 16s of epitaxial layer 16, are smaller. However, delineation in surface 11s of substrate 11 and surface 16s of layer 16 is still present. Delineation amounts 11e or 11g may be avoided in the prior art by not oxidizing substrate 11 to obtain mask portions 15 or 15b. However, without delineation amounts 11e or 11g there is no delineation 16f or 16g in surface 16s of epitaxial layer 16 to mark the locations of underlying buried doped regions 13d.

A further weakness of prior art delineation techniques is that pattern shift can occur during formation of epitaxial layer 16, as indicated in FIGS. 1E and 1H. Depending upon the growth conditions, corner 11c does not always propagate vertically in layer 16. Under those circumstances, corner 16c does not lie above corner 11c, but is shifted by angle 16a and amount 16b. Thus, when height difference 16f and/or 16g, and/or corners 16c are used for alignment purposes to align subsequent device regions to buried doped regions 13d and 14d, a systematic error occurs. This error is shown by angle 16a and amount 16b in FIG. 1E or 1H.

These and other limitations and disadvantages of the prior art may be overcome with the methods and means of the present invention. FIGS. 2A-J show simplified schematic cross-sectional views of semiconductor wafer or substrate 20 at various stages of manufacturer, according to the present invention. Semiconductor wafer 20 has device portion 20a wherein various device regions will be formed and alignment key portion 20b wherein an alignment key will be formed. Wafer 20 is covered with first masking layer 21 of a material with a modifiable etch rate (FIG. 2A). It is convenient to form masking layer 21 of a double layer comprising upper etch rate modifiable layer 21a and lower etch-stop layer 21b. Lower etch-stop layer 21b should-be of a material which is resistant to etchants which etch upper layer 21a in order to protect substrate 20 during etching of layer 21a. Upper layer 21a is conveniently formed from polycrystalline silicon and lower layer 21b is conveniently formed from silicon oxide or silicon nitride. However, other materials can be used provided they have modifiable etch rates (for layer 21a), and appropriate etch resistance (for layer 21b), and are sufficiently stable so as to withstand subsequent processing steps. A thickness of 0.2 microns was found to be convenient for layer 21a formed from polysilicon, although thicknesses in the range 0.1 to 0.5 microns are useful. A thickness of 0.01 microns was found to be useful for layer 21b although thicker or thinner layers could be used, consistent with the requirements that layer 21b be thick enough to protect substrate 20 during etching of layer 21a, and not so thick as to preclude doping of underlying regions 24a through layer 21b.

First masking layer 21 is covered in turn by second masking layer 22 having therein open portions 22a over device portion 20a of substrate 20, and open portions 22b over alignment key portion 20b of substrate 20 (FIG. 2B). Second mask layer 22 is conveniently formed of photoresist or the like. As will be subsequently explained, the location and size of the buried doped regions to be formed in device portion 20a of substrate 20 are determined by the size and spacing of open portions 22a.

Buried doped first regions 24a are then formed in device portion 20a of substrate 20, preferably by implanting ions 23 through those portions of first masking layer 21 exposed in opening 22a of second mask layer 22. Second mask layer 22 must be of sufficient mass and thickness to protect the covered portions of layer 21 and substrate 20 during the doping of first regions 24a. Since openings 22b also exist in mask layer 22, doped first regions 24b in alignment key portion 20b of substrate 20 are formed at the same time as first regions 24a in device portion 20a. However, first regions 24b are not essential to any device or alignment function, hence their formation is merely incidental.

It is convenient to form doped first regions 24a by implanting ions 23 through mask layer 21. Where doped first regions 24a are desired to be P+ regions, doping is conveniently accomplished for thicknesses of layers 21a-b as described above, by implanting boron ions at 160 KeV to a dose of about $6 \times 10^{13}$ ions per square cm. At this energy, the boron ions pass through mask layer 21 and are deposited in substrate 20 to form buried doped regions 24a. During this implant operation, the substrate temperature must be kept sufficiently low so as not to damage mask layer 22. Where mask layer 22 is of common photoresist, the temperature of substrate 20 should be kept below about 150 degrees C. Other thicknesses of masking layer 21 may also be used. Those of skill in the art will understand that different accelerating voltages are required for different thicknesses and densities of mask layer 21.

Without removing mask layer 22, portions 211a-b of mask layer 21 exposed in openings 22a-b of mask layer 22, and having lateral boundaries 31a-b, are treated to decrease their etch rate. This is conveniently accomplished in the case where layer 21 is of polysilicon by ion implanting a high dose of boron ions 25 into layer 21. For a polysilicon thickness of about 0.2 microns for layer 21i a, a dose of $1 \times 10^{16}$ ions per square cm. at about 40 KeV was found to be suitable, with doses in the range $5 \times 10^{15}$ to $2 \times 10^{16}$ ions per square cm. at energies in the range 20 to 60 KeV being useful. It is important that the change in etch rate induced by the treatment (e.g. implantation of impurities) applied to portions 211a-b be substantial as compared to the unaltered etch rate of the remainder of layer 21a protected under mask layer 22. Those of skill in the art will understood that as the thickness of layer 21 or 21a is varied, that the implantation energy should be varied in proportion so that the implanted impurities are deposited in layer 21a, and not substantially elsewhere. However, where portions 211a-b are being doped with the same type impurity as was used to form regions 24a-b, as in this example, implantation of some additional ions into regions 24a-b during the alteration of the etch rate of regions 211a-b causes no harm.

Layer 22 may now be removed using means well known in the art. Substrate 20 with layer 21 is then treated so as to laterally expand etch rate altered regions 211a-b in layer 21 (FIG. 2D) to form expanded etch rate altered regions 211A-B (FIG. 2E). Where layer portion 21a is of polysilicon which has been doped with ions 25 to alter its etch rate, this is conveniently accomplished by heating substrate 20 and layer 21 to cause lateral diffusion of ions 25 so that boundaries 31a-b of regions 211a-b move laterally outward, as indicated by arrows 32 in FIG. 2E, to positions 33a-b at the boundaries of expanded regions 211A-B. Lateral spreading amount 24d from original boundary positions 31a-b of regions 211a-b to new boundary positions 33a-b of expanded regions 211A-B can be controlled by varying the time and duration of the heat treatment. When portions 211a–b have been doped as indicated above, heating to 900 degrees C. for 60 minutes is useful for expanding portions 211a–b laterally by approximately one micron in each lateral direction, to achieve expanded portions 211A–B. Other times and temperatures can be used depending upon whether larger or smaller lateral expansion amounts 24d are desired. Techniques for determining the lateral diffusion of impurities in single crystal or polycrystalline semiconductor materials as a function of time and temperature are well known in the art. Generally, lateral expansion amounts 24d in the range 0.1 to 2 or more microns can be achieved. With boron in silicon, temperatures and times in the range 800° to 900° C. and 10 to 120 minutes are useful. These times and temperatures are significantly below the values required for appreciable lateral diffusion of the same impurities impurities in single crystal material.

As indicated in FIGS. 2D–E, regions 211a–b spread laterally to form expanded regions 211A–b while buried doped first regions 24a–b remain virtually unchanged in lateral extent. This is a consequence of the fact that diffusion takes place much more rapidly in poly-layer 21a than in single crystal substrate 20. Hence boundaries 31a–b of etch rate altered regions 211a–b can be expanded by amounts 24d to boundaries 33a–b of expanded etch rate altered regions 211A–B, relative to buried doped first regions 24a–b. This is a particular advantage of the invented process since lateral spreading amounts 24d are used to independently control the lateral separation of buried doped first regions 24a–b and buried doped second regions 28a–b to be formed in a subsequent step.

Figure 2F:
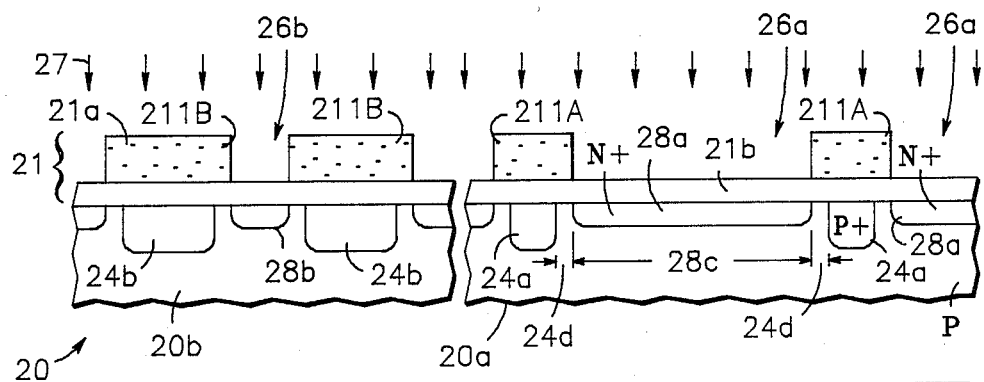

Following treatment of layer 21a to expand etch rate altered regions 211a–b to achieve expanded etch rate altered regions 211A–B, portions 212A of layer 21a lying between expanded regions 211A of layer 21a above device portion 20a of substrate 20 are removed to create holes 26a in layer 21a, taking advantage of the altered etch rate portions of 211A. Similarly, portion 212B of layer 21a lying between expanded regions 211B of layer 21a above alignment key portion 20b of substrate 20 is also removed, to create hole 26b in layer 21a. Layer 21b conveniently protects substrate 20 during this step. Dip etching in a solution of KOH in water is a suitable means for removing portions 212A–B of layer 21a since KOH attacks undoped polysilicon more rapidly than strongly P-doped polysilicon. Other differential etching means may also be used. As a result of this etching step, expanded etch rate altered portions 211A–B of layer 21a remain on substrate 20, as is indicated in FIG. 2F, with holes 26a–b corresponding to the positions of non-etch rate altered portions 212A–B.

Buried doped second regions 28a of width 28c are then formed in device portions 20a of substrate 20 through openings 26a in layer 21a. Second regions 28a are separated from first regions 24a substantially by lateral expansion amount 24d. Buried doped second regions 28a are conveniently formed by implanting impurity ions 27, as indicated in FIG. 2F. For a typical bipolar integrated circuit utilizing P-type substrate 20 and P+ channel-stop regions 24a, ions 27 will be N-type so that buried doped second regions 28a may function as N+ buried collector regions. Since hole 26b is also present in layer 21a during this operation, ions 27 will also dope alignment key portion 20b of substrate 20 in buried doped second region 28b. However, this is merely incidental to the formation of buried doped second regions 28a, and doping of region 28b is not essential to the devices which will be subsequently formed in device portion 20a of substrate 20.

Figure 2G:
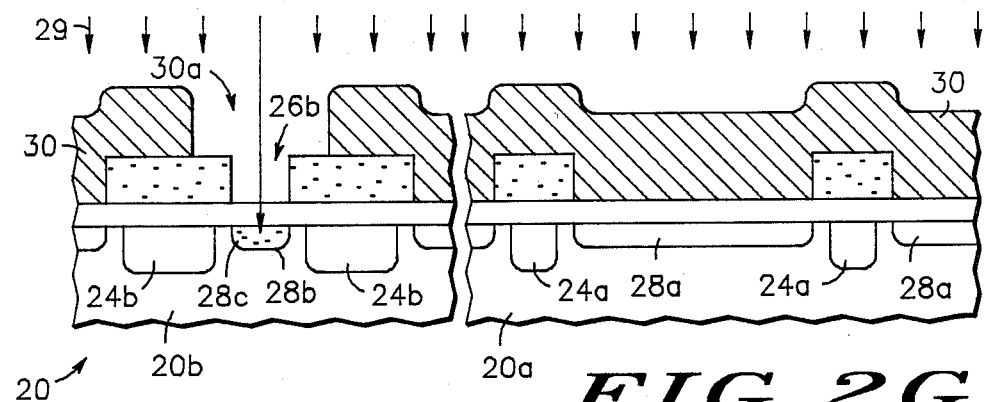

As shown in FIG. 2G, substrate 20 and layer 21 is then covered by third mask layer 30, typically of photoresist, using means well known in the art. Hole 30a is provided in mask layer 30, located above openings 26b in layer 21a. Hole 30a can be larger than hole 26b in layer 21a and need not be precision aligned with hole 26b. Thus, hole 30a is easily provided. Region 28c of alignment key portion 20b of substrate 20, exposed under hole 26b of layer 21a and hole 30a of layer 30, is rendered non-single crystal. This may conveniently be accomplished by bombarding region 28c with energetic argon ions 29 having an energy in the range 80 to 100 KeV to a dose of at least $1 \times 10^{15}$ ions per square cm. Higher doses can also be used. Non-single crystal region 28c formed as a result of this or other treatment acts as an alignment key in substrate 20 which is automatically aligned with buried doped regions 24a and 28a, since key 28c and buried doped regions 24a and 28a are all derived from openings 22a–b in second mask layer 22. Since openings 22a–b were formed at the same time, they self-align and are free from alignment error or alignment tolerance.

Figure 2H:
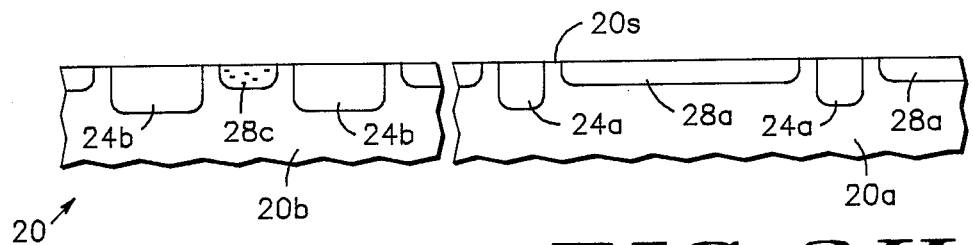

Following creation of non-single crystal alignment key 28c, mask layer 30 and remaining portions of mask layer 21 are removed from substrate 20 (FIG. 2H). Semiconductor layer 35 is then formed over substrate 20 using standard epitaxial techniques. For silicon, layer 35 is conveniently deposited in an epitaxial reactor at about 1000° C. and a pressure of about 80 Torr (10.6 kPa) using di-chlorosilane as a source of gas diluted with hydrogen. However, other conditions generally in the range 900° to 1200° C. and 60 to 100 Torr (7.98 to 13.3 kPa) can also be used.

Figure 2I:
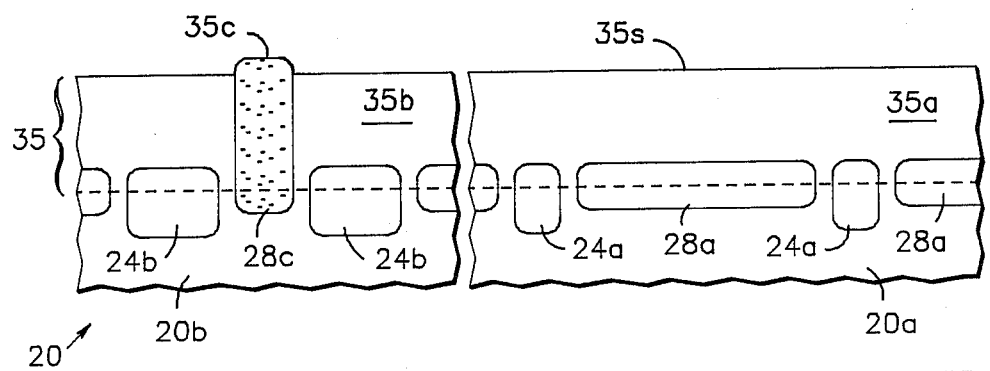
Figure 2J:
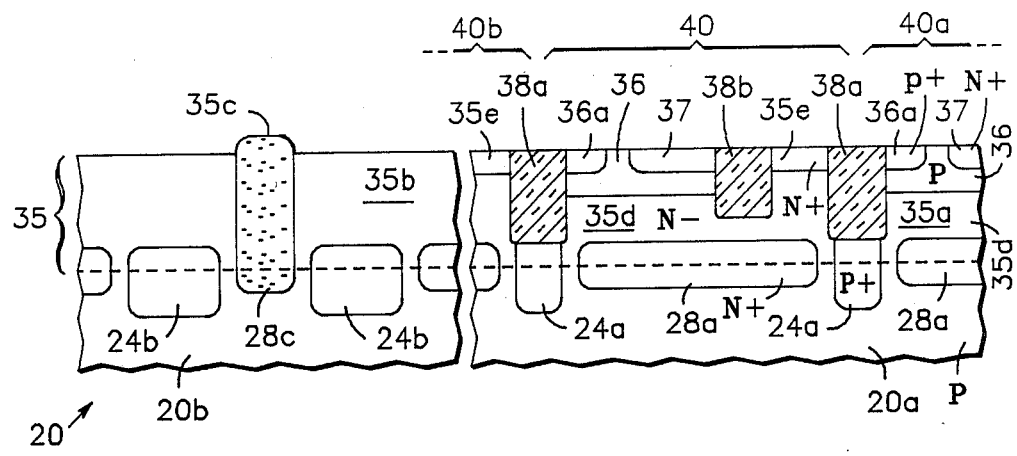

Epitaxial layers form a crystalline structure according to the crystalline structure of the substrate on which they are formed. As a consequence, portions 35a–b of layer 35 will be single crystal according to the single crystal nature of substrate portions 20a–b on which they are formed. Similarly, portion 35c of layer 35 will be non-single crystal according to the non-single crystal nature of alignment key 28c on which region 35c is formed. Generally, region 35c will be polycrystalline. As such it will have a noticeably different texture and appearance than single crystal regions 35a–b of layer 35. It may also have a slightly different height, as indicated in FIGS. 2I–J. However, the height difference, while useful, is not essential to the operation of the present invention since the difference in surface texture of non-single crystal region 35c as compared to single crystal regions 35a–b is enough to permit its location to be visually determined. Non-single crystal region 35c propagates substantially vertically through layer 35 as layer 35 is grown. Hence, region 35c projects the location of underlying alignment key 28c to the surface of epitaxial layer 35 in which the remaining active device regions are later formed.

Buried doped regions 24a and 28a, are not delineated in surface 20s of substrate 20. There is no need with the invented process to utilize any part of surface 20s to form a mask layer by consumption of material from surface 20s. Surface 20s is covered by layer 21, or at least portion 21b of layer 21 during formation of buried doped regions 24a and 28a. Hence the topology of surface 20s is unaffected by formation of these buried doped regions. Hence, the described process provides buried doped regions 24a and 28a free of delineation in surface 20s of device portion 20a of substrate 20. Since there is no delineation of buried doped regions 24a and 28a on surface 20s, there is also no delineation of buried doped regions 24a and 28a in surface 35s of layer 35. Since surface delineation on device portion 20a of substrate 20 has been avoided, more perfect epitaxial layer portion 35a may be formed above device portion 20a of substrate 20. This results in fewer defects in layer portion 35a and gives improved device performance and yield.

As illustrated in FIG. 2J, portion 35a of epitaxial layer is used to form device regions 40 and 40a-b by means well known in the art. Device region 40 contains N− collector region 35d with N+ contact region 36a, N+ emitter region 37, and dielectric isolation regions 38a-b, all formed by conventional techniques. In the example of FIG. 2J, devices 40 and 4a-b are illustrated as being identical and separated by dielectric isolation walls 38a. Dielectric isolation walls 38a are aligned above channel-stop regions 24a. Collector regions 35d lie above buried collector regions 28a. The various device regions formed from the exterior surface of layer 35 are aligned with buried doped regions 24a and 28a by means of alignment key 35c visible in surface 35s of layer 35, and propagated from self-aligned buried alignment key 28c. This permits device regions 36–38 of devices 40 and 40a-b to be aligned with respect to buried doped regions 24a and 28a with the same precision as if the buried doped regions themselves had been individually delineated.

Figure 3A:
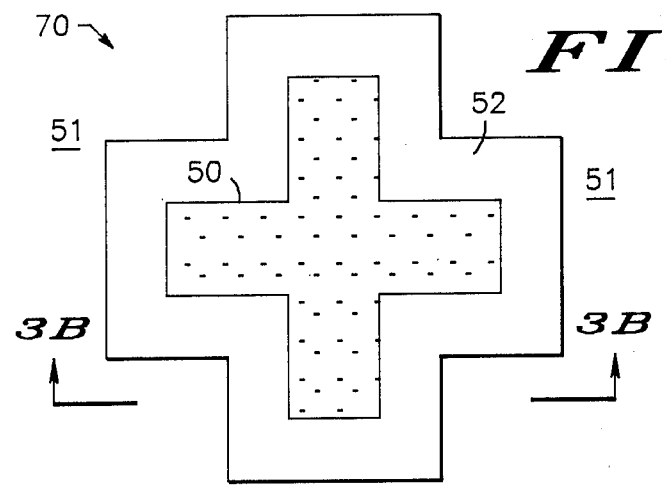
FIGS. 3A-B show a simplified top view and schematic cross-sectional view of an alignment key, according to a preferred embodiment of the present invention.
Figure 3B:
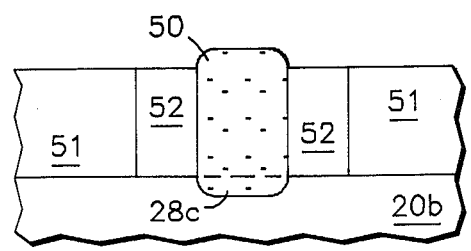

FIGS. 3A-B show in simplified form a top view and schematic cross-sectional view of an alignment key according to the present invention. Viewed from the top in FIG. 3A, alignment key 70 comprises polycrystalline portion 50 and adjacent single crystal portion 52 from which polycrystalline portion 50 may be distinguished by surface texture, or height, or both. Surrounding region 51 may be either single crystal or polycrystalline. FIG. 3B shows a schematic cross-sectional view through one arm of alignment key 70, in which may be seen polycrystalline region 50 formed above non-single crystal alignment key 28c in substrate portion 20b, and adjacent single crystal region 52. Surrounding region 51 may be single crystal or otherwise since it has no particular function with respect to alignment key 70. Alignment is made by detecting the location of polycrystalline region 50 in single crystal region 52.

Figure 4A:
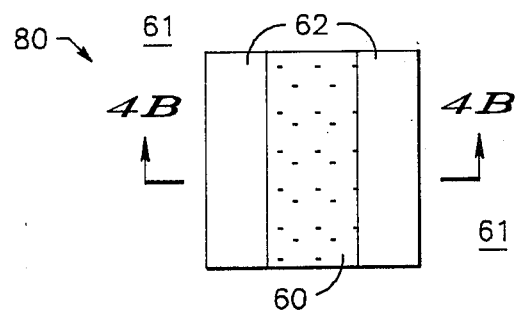
FIGS. 4A-B show a simplified tops view and schematic cross-sectional view of an alignment key according to another embodiment of the present invention.
Figure 4B:
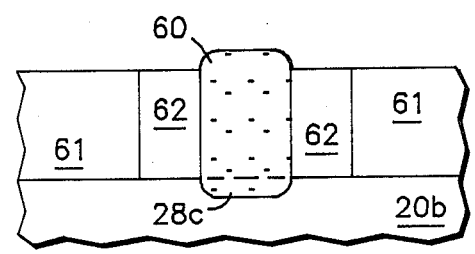

FIGS. 4A-B illustrates alignment key 80 according to another embodiment. Alignment key 80 comprises polycrystalline region 60 above non-single crystal alignment key 28c in alignment key portion 20b of substrate 20, and adjacent single crystal regions 62. Surrounding region 61 may be single crystal or not. FIG. 4B shows a schematic cross-section through FIG. 4A. Those of skill in the art will recognize that alignment key 70 generally provides two dimensional alignment capabilities, while alignment key 80 generally provides one dimensional alignment capabilities. Two dimensional alignment capabilities may be obtained with key 80 by using two or more keys arranged at right angles, or by forming both regions 61 and 62 from single crystal material. Alignment keys having other topographical shapes may also be used. Examples are circles, triangles, squares, polygons, stripes, crosses, stars, arcs, and combinations thereof.

Having thus described the invention, it is apparent that the present invention provides a means and method for constructing multiple buried doped regions which are self-aligned and free from surface delineation, yet still alignable to subsequently formed device regions by means of a self-aligned key which is propagated through the epitaxial layer grown above the buried doped regions. It is also apparent that the method and means of the present invention avoids defect formation in the epitaxial layer caused by delineation contours in the device portion of the substrate, and permits fabrication of devices and circuits having improved performance and yield, and lower cost. The self-alignment feature of the present invention with respect to the buried doped regions permits more compact circuits and devices to be made. Additionally, the present means and methods provides for control of the separation distance of the buried doped regions so that higher performance and more compact integrated circuits may be simultaneously achieved.

While the invented process has been illustrated in terms of particular combinations of conductivity and device types, those of skill in the art will understand that these are merely intended to be illustrative, and that the invented method can be used in connection with other combinations of conductivity types and other types of devices. Accordingly, it is intended to include all such variation within the claims which follows.

I claim:

1. A method for fabricating self-aligned buried doped regions in a semiconductor device, comprising:
    providing a semiconductor substrate having a device portion and an alignment key portion;
    covering a surface of said substrate with a first masking layer having a modifiable etch rate;
    covering said first layer with a second masking layer having first open portions exposing first portions of said first masking layer above first regions of said device portion of said substrate, and second open portions exposing second portions of said first masking layer located above first regions of said alignment key portion of said substrate;
    doping said first regions of said device portion of said substrate through said exposed first portions of said first masking layer;
    modifying said etch rate of said first and second portions of said first masking layer exposed in said first and second open portions of said second masking layer;
    creating holes in said first masking layer by removing those portions of said first masking layer whose etch rate has not been modified in the preceding steps, said holes in said first masking layer lying above second regions of said device portion and a key region of said alignment key portion of said substrate;
    doping said second regions of said device portion of said substrate through said holes in said first masking layer;
    rendering said key region of said alignment key portion of said substrate non-single crystal;
    exposing said surface of said substrate;
    forming a semiconductor layer on said surface of said substrate which is non-single crystal above said non-single crystal key region of said substrate and single crystal adjacent said non-single crystal key region and above said first and second regions of said device portion of said substrate.

2. The method of claim 1 further comprising, prior to said creating step, treating said first masking layer to laterally expand by a predetermined amount said first and second portions of said first masking layer having said modified etch rate.

3. The method of claim 1 wherein said first masking layer comprises a polycrystalline semiconductor layer.

4. The method of claim 1 wherein said first masking layer comprises a layer having a modifiable etch rate superposed on a layer resistant to etchants which etch said modifiable etch rate layer.

5. The method of claim 1 wherein said modifying step comprises doping said first masking layer to alter its etch rate.

6. The method of claim 1 further comprising, prior to said rendering step, covering said holes in said first masking layer, except for said hole above said key region of said alignment key portion of said substrate, with a third masking layer.

7. The method of claim 1 wherein said first doping step comprises ion implanting dopant ions into said substrate at an energy sufficiently high to penetrate through said first masking layer and come to rest within said substrate.

8. The method of claim 7 wherein said step of modifying said etch rate of said first and second portions of said first masking layer comprises implanting ions in said first masking layer to render it more resistant to etching.

9. The method of claim 8 wherein said second doping step comprises ion implantation.

10. The method of claim 1 wherein said exposing step comprises exposing said surface of said substrate without creating depressions in said surface of said device portion of said substrate.

11. A method for fabricating self-aligned buried doped regions in a semiconductor device, comprising:
providing a single crystal semiconductor substrate having a device portion and an alignment key portion;
covering a surface of said substrate with a first etch resistant layer;
covering said first etch resistant layer with a polycrystalline semiconductor layer;
forming a first masking layer on said polycrystalline semiconductor layer having first openings above said device portion and corresponding to the desired locations of a first of said buried doped regions, and second openings above said alignment key portions surrounding an alignment key region, wherein said first and second openings expose, respectively, first and second portions of said polycrystalline semiconductor layer;
bombardment doping said substrate with first dopant ions of a first type and having energy sufficient to penetrate said polycrystalline semiconductor layer and said first etch resistant layer but not sufficient to penetrate said first masking layer, in order to dope said first of said buried doped regions through said first openings;
doping said first and second portions of said polycrystalline semiconductor layer exposed in said first and second openings with a second dopant to a concentration sufficient to alter the etch rate of said first and second portions of said polycrystalline semiconductor layer;
heating said polycrystalline semiconductor layer to laterally spread by predetermined amounts said second dopant placed in said exposed portions of said polycrystalline semiconductor layer, so as to produce enlarged first and second portions of said polycrystalline layer having altered etch rate;
differentially etching said polycrystalline semiconductor layer to remove those parts of said polycrystalline layer lying outside said enlarged first and second portions;
using remaining portions of said polycrystalline semiconductor layer as a mask, doping said substrate to form a second of said buried doped regions in said device portion of said substrate;
covering said device portion of said substrate with a second masking layer that, in combination with remaining portions of said polycrystalline semiconductor layer, leaves accessible a key region in said alignment key portion of said substrate;
rendering said key region in said alignment key portion of said substrate non-single crystal;
exposing said surface of said substrate;
growing a semiconductor layer on said substrate which is non-single crystal above said non-single crystal portion of said substrate and single crystal above said device portion of said substrate; and
forming device regions in said single crystal portion of said semiconductor layer aligned with respect to said first and second buried doped regions using said polycrystalline portion of said semiconductor layer as an alignment key.

12. The method of claim 11 wherein said heating step comprises laterally spreading said second dopant ions in said polycrystalline semiconductor layer by a larger amount than said first dopant ions in said substrate.

13. A method for fabricating un-delineated buried doped regions in a semiconductor device, comprising:
providing a semiconductor substrate having a device portion and an alignment key portion in a smooth first surface;
covering said smooth first surface of said substrate with a first masking layer having a modifiable etch rate;
covering said first masking layer with a second masking layer having first open portions exposing first portions of said first masking layer located above first regions of said device portion of said substrate, and second open portions exposing second portions of said first masking layer located above first regions of said alignment key portion of said substrate;
doping said first regions of said device portion of said substrate through said exposed first portions of said first masking layer, without delineation of said first regions so that said device portion of said substrate remains smooth;
modifying said etch rate of said first and second portions of said first masking layer exposed in said first and second open portions of said second masking layer;
creating holes in said first masking layer by removing those portions of said first masking layer whose etch rate has not been modified in the preceding steps, said holes in said first masking layer lying above second regions of said device portion of said substrate and above a key portion of said alignment key portion of said substrate;
doping said second regions of said device portion of said substrate through said holes in said first masking layer, without delineation of said second regions so that said device portion of said substrate remains smooth;

rendering said key region of said alignment key portion of said substrate non-single crystal;

exposing said surface of said substrate;

forming a semiconductor layer on said surface of said substrate which is non-single crystal above said non-single crystal key region of said substrate and single crystal adjacent said non-single crystal key region; and forming a smooth single crystal semiconductor layer on said smooth surface of said device portion of said substrate, wherein said smooth single crystal semiconductor layer covers said first and second regions of said device ortion of said substrate without delineation.

14. The method of claim 13 further comprising, prior to said creating step, treating said first masking layer to laterally expand said first and second portions of said first masking layer having modified etch rate, by a predetermined amount.

15. The method of claim 13 wherein said first masking layer comprises a polycrystalline semiconductor layer.

16. The method of claim 13 wherein said first masking layer comprises a modifiable etch rate layer superposed on a layer resistant to etchants which etch said modifiable etch rate.

17. The method of claim 13 wherein said modifying step comprises doping said first masking layer to alter its etch rate.

18. The method of claim 13 further comprising, prior to said rendering step, covering said holes in said first masking layer, except for said hole above said key region of said alignment key portion of said substrate, with a third masking layer.

19. The method of claim 13 wherein said first doping step comprises ion implanting dopants ions into said substrate at an energy sufficiently high to penetrate through said first masking layer and come to rest within said substrate.

20. The method of claim 19 wherein said step of modifying said etch rate of said first and second portions of said first masking layer comprises implanting ions in said first masking layer to render it more resistant to etching.

* * * * *